United States Patent
Yang et al.

(10) Patent No.: US 11,217,746 B2
(45) Date of Patent: Jan. 4, 2022

(54) ION BEAM ETCHING FABRICATED SUB 30NM VIAS TO REDUCE CONDUCTIVE MATERIAL RE-DEPOSITION FOR SUB 60NM MRAM DEVICES

(71) Applicant: Taiwan Semiconductor Manufacturing Company, Ltd., Hsin-Chu (TW)

(72) Inventors: Yi Yang, Fremont, CA (US); Dongna Shen, San Jose, CA (US); Zhongjian Teng, Santa Clara, CA (US); Jesmin Haq, Milpitas, CA (US); Yu-Jen Wang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/894,033

(22) Filed: Jun. 5, 2020

(65) Prior Publication Data

US 2020/0303636 A1    Sep. 24, 2020

Related U.S. Application Data

(63) Continuation of application No. 15/947,512, filed on Apr. 6, 2018, now Pat. No. 10,680,168.

(51) Int. Cl.
| | |
|---|---|
| *H01L 43/12* | (2006.01) |
| *H01L 43/08* | (2006.01) |
| *G11C 11/16* | (2006.01) |
| *H01L 43/02* | (2006.01) |
| *B82Y 25/00* | (2011.01) |

(52) U.S. Cl.
CPC ............ *H01L 43/12* (2013.01); *G11C 11/161* (2013.01); *H01L 43/02* (2013.01); *H01L 43/08* (2013.01); *B82Y 25/00* (2013.01)

(58) Field of Classification Search
CPC ......... H01L 43/12; H01L 43/02; H01L 43/08; G11C 11/161; B82Y 25/00
USPC ......................................................... 257/421
See application file for complete search history.

(56) References Cited

U.S. PATENT DOCUMENTS

| | | | |
|---|---|---|---|
| 8,324,698 B2 | 12/2012 | Zhong et al. | |
| 8,883,520 B2 | 11/2014 | Satoh et al. | |
| 9,716,222 B1 * | 7/2017 | Chuang | H01L 27/222 |
| 9,972,777 B1 * | 5/2018 | Haq | H01L 43/12 |
| 2011/0216447 A1 * | 9/2011 | Li | G11B 5/1278 |
| | | | 360/313 |

(Continued)

*Primary Examiner* — Jami Valentine Miller
(74) *Attorney, Agent, or Firm* — Haynes and Boone, LLP

(57) ABSTRACT

A metal layer and first dielectric hard mask are deposited on a bottom electrode. These are patterned and etched to a first pattern size. The patterned metal layer is trimmed using IBE at an angle of 70-90 degrees wherein the metal layer is reduced to a second pattern size smaller than the first pattern size. A dielectric layer is deposited surrounding the patterned metal layer and polished to expose a top surface of the patterned metal layer to form a via connection to the bottom electrode. A MTJ stack is deposited on the dielectric layer and via connection. The MTJ stack is etched to a pattern size larger than the via size wherein an over etching is performed. Re-deposition material is formed on sidewalls of the dielectric layer underlying the MTJ device and not on sidewalls of a barrier layer of the MTJ device.

20 Claims, 2 Drawing Sheets

(56) References Cited

U.S. PATENT DOCUMENTS

| | | | | |
|---|---|---|---|---|
| 2013/0267042 A1* | 10/2013 | Satoh | ............... | H01L 27/222 |
| | | | | 438/3 |
| 2014/0116984 A1* | 5/2014 | Ding | ............... | G01R 33/093 |
| | | | | 216/22 |
| 2014/0252439 A1* | 9/2014 | Guo | ............... | G11C 11/18 |
| | | | | 257/295 |
| 2015/0104882 A1* | 4/2015 | Jung | ............... | H01L 27/222 |
| | | | | 438/3 |
| 2017/0148976 A1* | 5/2017 | Annunziata | ............... | H01L 43/02 |
| 2018/0294405 A1* | 10/2018 | Wang | ............... | H01L 21/311 |
| 2019/0165259 A1* | 5/2019 | Liao | ............... | H01L 43/12 |
| 2019/0312197 A1* | 10/2019 | Yang | ............... | G11C 11/161 |

\* cited by examiner

ION BEAM ETCHING FABRICATED SUB 30NM VIAS TO REDUCE CONDUCTIVE MATERIAL RE-DEPOSITION FOR SUB 60NM MRAM DEVICES

PRIORITY DATA

The present application is a continuation application of U.S. patent application Ser. No. 15/947,512, filed Apr. 6, 2018, which is herein incorporated by reference in its entirety.

TECHNICAL FIELD

This application relates to the general field of magnetic tunneling junctions (MTJ) and, more particularly, to etching methods for forming sub 60 nm MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define those millions of magnetic tunneling junction (MTJ) cells in each MRAM device and make them non-interacting to each other, precise patterning steps including RIE (reactive ion etching) are usually involved. During RIE, high energy ions remove materials vertically in those areas not masked by photoresist, separating one MTJ cell from another. However, the high energy ions can also react with the non-removed materials, oxygen, moisture and other chemicals laterally, causing sidewall damage and lowered device performance.

To solve this issue, pure physical etching techniques such as ion beam etching (IBE) have been applied to trim the surface of the MTJ stack to remove the damaged portion. However, due to their non-volatile nature, IBE trimmed conductive materials in the MTJ and bottom electrode can be re-deposited onto the tunnel barrier, resulting in shorted devices. A new device structure and associated process flow which can reduce this conductive material re-deposition are needed if one wants to fully utilize the benefits of physical etching.

Several patents teach methods of forming the bottom electrode to MTJ connection while avoiding re-deposition of metal on the MTJ sidewalls, including U.S. Pat. No. 8,324,698 (Zhong et al) and U.S. Pat. No. 8,883,520 (Satoh et al). These references are different from the present disclosure.

SUMMARY

It is an object of the present disclosure to provide an improved method of forming MTJ structures without re-deposition of metal materials on the tunnel barrier layer.

Another object of the present disclosure is to provide a method of forming a dielectric-enclosed via connection between the bottom electrode and overlying MTJ structures to prevent re-deposition of metal materials on the tunnel barrier layer.

Yet another object of the present disclosure is to provide a method of forming a dielectric-enclosed via connection between the bottom electrode and overlying MTJ structures wherein the via connection is narrower than the MTJ stack pattern to prevent re-deposition of metal materials on the tunnel barrier layer.

In accordance with the objectives of the present disclosure, a method for etching a magnetic tunneling junction (MTJ) structure is achieved. A metal layer is deposited on a bottom electrode. A first dielectric hard mask is deposited on the metal layer. The first dielectric hard mask and the metal layer are patterned and etched to a first pattern size. The patterned metal layer is trimmed using ion beam etching (IBE) at an angle of 70-90 degrees with respect to a normal line to a top surface of the metal layer wherein the first dielectric hard mask is removed and the metal layer is reduced to a second pattern size smaller than the first pattern size. A dielectric layer is deposited surrounding the patterned metal layer and polished to expose a top surface of the patterned metal layer to form a via connection to the bottom electrode. A MTJ stack is deposited on the dielectric layer and via connection. A second dielectric hard mask is deposited over the MTJ stack. Thereafter, the second dielectric hard mask and the MTJ stack are etched wherein an over etching is performed. This forms a MTJ device. The dielectric layer surrounding the via connection is etched into wherein re-deposition material is formed on sidewalls of the dielectric layer underlying the MTJ device and not on sidewalls of a barrier layer of the MTJ device because the MTJ device has a third pattern size larger than the second pattern size.

Also in accordance with the objects of the present disclosure, a magnetic tunneling junction (MTJ) is achieved comprising a sub-60 nm MTJ device and a bottom electrode underlying the MTJ device and connected to the MTJ device by a metal via through a dielectric layer wherein the metal via has a width at least 5 nm narrower than the MTJ device.

BRIEF DESCRIPTION OF THE DRAWINGS

In the accompanying drawings forming a material part of this description, there is shown.

DETAILED DESCRIPTION

In the process of the present disclosure, by using a high angle ion beam etching (IBE), we can create sub 30 nm vias connecting the bottom electrode and sub 60 nm MTJ. These small vias are surrounded by dielectric materials and smaller than the MTJ, so that the conductive material re-deposition from the bottom electrode during MTJ etch can be avoided. A great over etch also becomes possible to confine the overall conductive material re-deposition from the MTJ stack below the MTJ junction, effectively reducing the shorted devices. It should be noted that we achieve these sub 30 nm vias using the much more affordable 248 nm photolithography, instead of the expensive immersion 193 nm or EUV photolithography.

By controlling the IBE trimming time, power, and angle with respect to the pattern, we can adjust the via size with respect to the MTJ to ensure that these vias surrounded by dielectric materials are smaller than the MTJ devices.

Conventionally, the MTJ stack is deposited and patterned on top of a large bottom electrode directly. Any conductive material re-deposition from the MTJ and bottom electrode during MTJ etch is unavoidable, resulting in electrically shorted devices.

Figure 1:
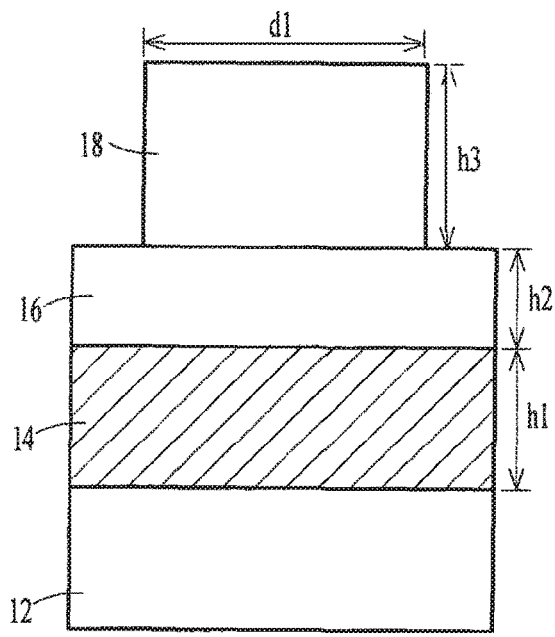
FIGS. 1 through 8 illustrate in cross-sectional representation steps in a preferred embodiment of the present disclosure.

The preferred embodiment of the present disclosure will be described in more detail with reference to FIGS. 1-8. FIG. 1 illustrates a bottom electrode layer 12 formed on a semiconductor substrate, not shown. Bottom electrode 12 is preferably Ti, TiN, Ta, or TaN. Now, a metal layer 14 is deposited onto the bottom electrode. The metal layer 14 may be Ta, TaN, Ti, TiN, W, Cu, Mg, Ru, Cr, Co, Fe, Ni or their alloys with a thickness h1 of 10 to 100 nm, and preferably ≥50 nm. A dielectric hard mask 16 such as $SiO_2$, SiN, SiON, SiC or SiCN with thickness h2 of ≥90 nm is then deposited on the metal layer 14. A photoresist 18 is patterned by 248 nm photolithography, forming patterns with size d1 of between about 70 and 80 nm and a height h3 of ≥200 nm.

Figure 2:
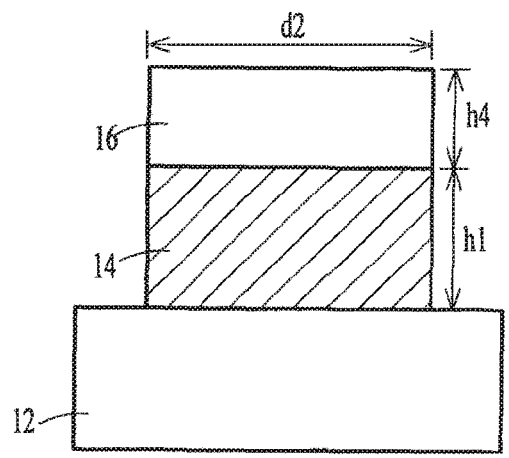

Now, as illustrated in FIG. 2, the dielectric hard mask 16 and the metal 14 are etched by RIE which uses fluorine carbon based plasma such as $CF_4$ or $CHF_3$ alone, or mixed with Ar and $N_2$. $O_2$ can be added to the etching plasma to reduce the MTJ size further. The dielectric hard mask and metal layer can also be patterned by a physical etch such as IBE or RIE using pure Ar plasma. Depending on the thickness of the metal layer 14, the dielectric hard mask 16 can be partially consumed, having a height h4 that can be less than h2. The metal layer 14 remaining thickness is still h1 (≥50 nm) with a pattern size d2 (between about 50 and 60 nm).

Figure 3:
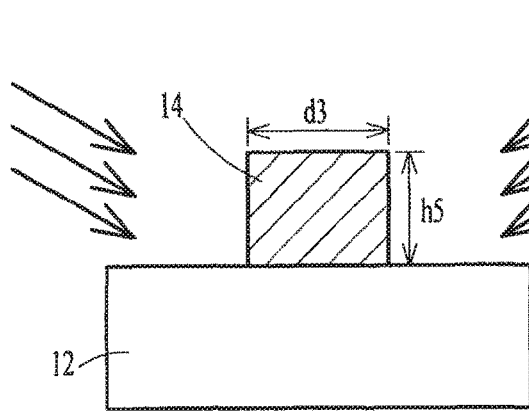

Next, as shown in FIG. 3, IBE trimming 20 is applied, with a high angle of between about 70 and 900 with respect to the surface's normal line. The metal pattern 14 decreases horizontally to d3, which can range from 10 to 40 nm, depending on the IBE trimming conditions such as RF power (500-1000 W) and time (100-500 sec). Due to the protection of the remaining dielectric 16 on top and the extremely low vertical etch rate (≤5 A/sec) of IBE at such a large angle, the remaining TiN height h5 after IBE trimming is the same as h1 or decreases less than 5 nm after this step.

Ex-situ IBE trimming is used when the metal vias are made of inert metals and in-situ IBE trimming is needed for metals that can be readily oxidized in air. For in situ IBE trimming, wafers are transferred from the previous etch step to the later trimming step without breaking vacuum, so that the vias are not exposed to air to oxidize. For ex situ, the transfer step is done under atmosphere. Therefore, in situ is preferred for materials that are easy to oxidize. Compared to the immersion 193 nm or EUV photolithography which is widely used to deliver similar results in the IC industry, this high angle IBE trimming is a much lower cost method.

Figure 4:
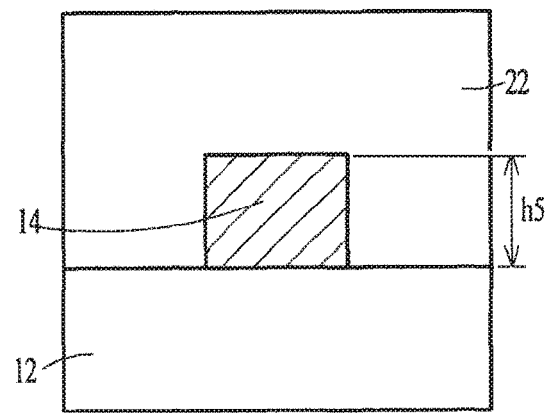

Referring now to FIG. 4, a second dielectric material 22 such as $SiO_2$, SiN, SiON, SiC, or SiCN with a thickness of ≥100 nm is deposited to encapsulate the vias. This encapsulation material can be deposited by physical vapor deposition (PVD), chemical vapor deposition (CVD), or atomic layer deposition (ALD). Ex-situ encapsulation is used when the metal vias are made of inert metals and in-situ encapsulation is needed for metals that can be readily oxidized in air.

Figure 5:
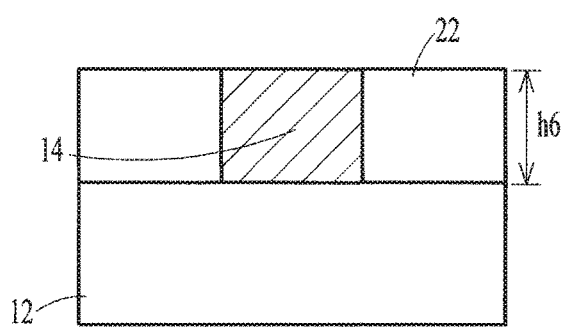
Figure 6:
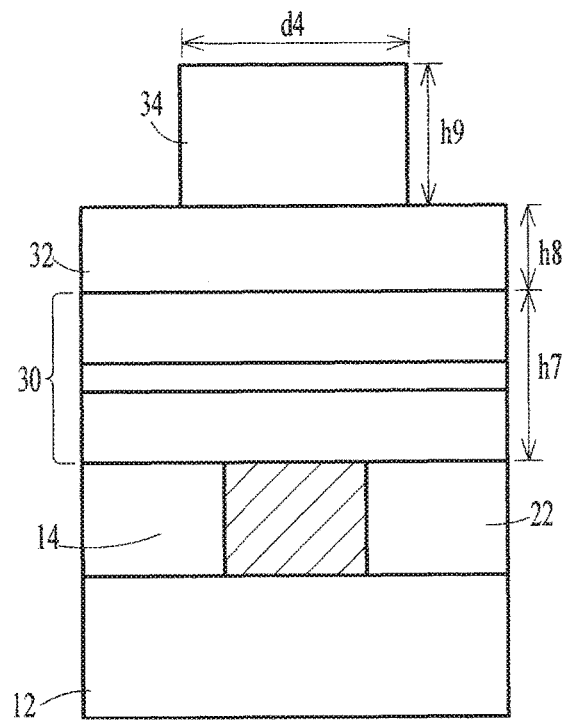

Chemical mechanical polishing (CMP) is applied to smooth the surface of the dielectric layer 22 as well as to expose the metal vias 14 underneath, with remaining via height h6 of ≥45 nm, as shown in FIG. 5.

Next, the MTJ film layers are deposited, typically including a seed layer, a pinned layer, a barrier layer, a free layer, and a cap layer, for example. These layers form the MTJ film stack 30, having a thickness h7 of between about 10 and 30 nm. A dielectric hard mask 32 such as $SiO_2$, SiN, SiON, SiC, or SiCN with a thickness h8 of ≥20 nm is deposited over the via 14 and dielectric encapsulate layer 22. A photoresist mask 34 is formed over the stack having a height h9 of between about 20 and 30 nm and a pattern size d4 of between about 70 and 80 nm.

Figure 7:
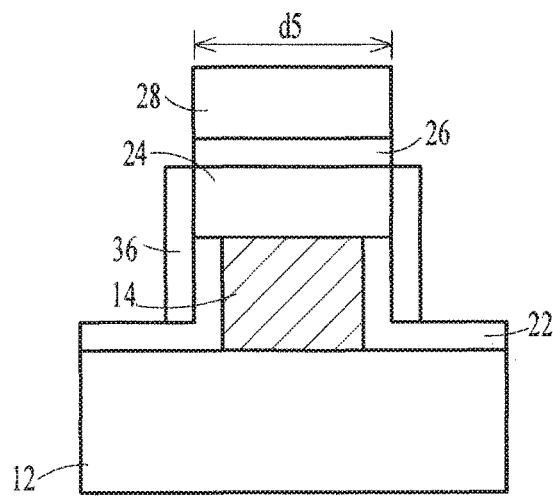

The hard mask 32 and MTJ stack 30 are patterned by 248 nm photolithography, RIE, IBE or their combination, as shown in FIG. 7. The final MTJ pattern size d5 is between about 70 and 80 nm.

If the patterning stops right after pinned layer (PL) 24 is etched, the non-volatile conductive material re-deposition from the MTJ itself would cover the barrier layer 26 on its sidewalls, resulting in electrically shorted devices. To avoid this, a great over etch is applied so that any non-volatile metal re-deposition 36 only covers the area below the barrier layer 26, as shown in FIG. 7, reducing shorted devices and improving the performance. This over etch will not introduce more conductive material re-deposition from the bottom electrode because the sub 30 nm vias 14 underneath are overlaid by the MTJ stack and surrounded by dielectric material.

Figure 8:
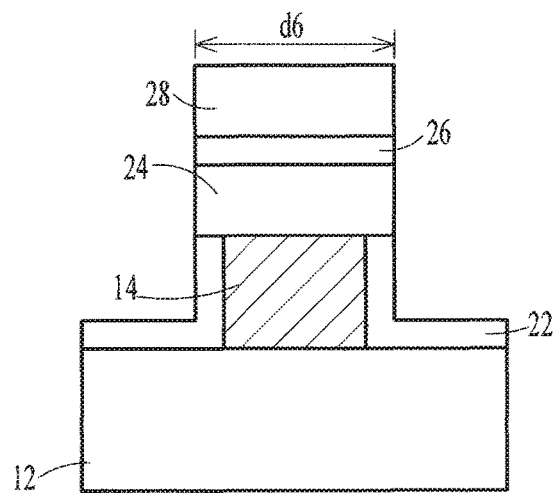

Optionally, IBE trimming is applied after the over etch to remove the sidewall damage. FIG. 8 illustrates the completed MTJ device after IBE trimming where the final MTJ size d6 is between about 50 and 60 nm. The MTJ stack is 70-80 nm or 50-60 nm wide, depending on whether or not IBE trimming is applied to remove the sidewall damage. In either case, the MTJ 30 is at least 5 nm wider than the vias 14 underneath so that the photolithography overlay margin is covered.

Compared to the prior art, the process of the present disclosure can greatly reduce the non-volatile conductive material re-deposition and thus the electrically shorted devices. Moreover, it creates sub 30 nm vias using IBE, a much lower cost technique than the complex and expensive immersion 193 nm or EUV photolithography.

The process of the present disclosure will be used for MRAM chips of size smaller than 60 nm as problems associated with chemically damaged sidewall and re-deposition from the bottom electrode become very severe for these smaller sized MRAM chips.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method comprising:
   forming a metal via on a bottom electrode;
   forming a dielectric layer on the metal via;
   removing a portion of the dielectric layer to expose a portion of the metal via;
   forming a magnetic tunneling junction (MTJ) stack on the exposed portion of the metal via; and
   patterning the MTJ stack such that re-deposition material is formed on the dielectric layer.

2. The method of claim 1, wherein the MTJ stack includes a pinned layer and a barrier layer disposed over the pinned layer, and
   wherein re-deposition material is formed on the pinned layer without being formed on the barrier layer after the patterning of the MTJ stack.

3. The method of claim 1, further comprising removing the re-deposition material from the dielectric layer.

4. The method of claim 1, wherein the forming of the metal via on a bottom electrode includes:
   forming a metal layer directly on the bottom electrode;
   patterning the metal layer to expose a portion of a top surface of the bottom electrode; and
   patterning the patterned metal layer to form the metal via.

5. The method of claim 1, further comprising:
forming a hard mask layer on the MTJ stack;
forming a photoresist layer on the hard mask layer, and wherein the patterning of the MTJ stack includes using the hard mask layer and the photoresist layer as a mask while patterning the MTJ stack.

6. The method of claim 1, wherein the patterning of the MTJ stack includes removing a portion of the dielectric layer such that a remaining portion of the dielectric layer is disposed along a sidewall of the metal via.

7. The method of claim 6, wherein the remaining portion of the dielectric layer has an L-shaped cross-sectional profile.

8. A method comprising:
forming a metal layer on a bottom electrode;
patterning the metal layer;
patterning the patterned metal layer to form a metal via;
forming a dielectric layer covering the metal via such that the metal via is embedded within the dielectric layer;
recessing the dielectric layer to expose the metal via;
forming a stack of magnetic tunneling junction (MTJ) layers on the exposed metal via; and
patterning the stack of MTJ layers and the recessed dielectric layer such that re-deposition material is formed on sidewalls of the patterned recessed dielectric layer and a pinned layer of the patterned MTJ stack.

9. The method of claim 8, wherein sidewalls of a barrier layer of the patterned MTJ stack is free of the re-deposition material after the patterning of the stack of MTJ layers and the recessed dielectric layer.

10. The method of claim 8, further comprising removing the re-deposition material from the sidewalls of the patterned recessed dielectric layer to expose the sidewalls of the patterned recessed dielectric layer.

11. The method of claim 8, wherein the patterning of the metal layer includes applying a reactive ion etching process, and
wherein the patterning of the patterned metal layer to form the metal via includes applying an ion beam etching process.

12. The method of claim 8, wherein the patterning of the metal layer includes applying a plasma etching process that includes a material selected from the group consisting of fluorine, carbon and argon.

13. The method of claim 8, wherein the patterning of the metal layer includes forming a first dielectric hard mask layer directly on the metal layer and patterning the metal layer while using the first dielectric hard mask as a mask, and wherein the patterning of the stack of MTJ layers and the recessed dielectric layer includes forming a second dielectric hard mask layer directly on the stack of MTJ layers and patterning the stack of MTJ layers while using the second dielectric hard mask as a mask.

14. The method of claim 8, wherein the forming of the stack of MTJ layers on the exposed metal via includes forming the stack of MTJ layer directly on the exposed via and directly on the recessed dielectric layer.

15. The method of claim 8, wherein the recessing of the dielectric layer to expose the metal via includes performing a chemical mechanical polishing process on the dielectric layer to expose the metal via.

16. A method comprising:
encapsulating a conductive via in a dielectric material;
removing a portion of the dielectric material to expose a top surface of the conductive via, wherein a remaining portion of the dielectric material is disposed on sidewalls of the conductive via after the removing of the portion of the dielectric material to expose the top surface of the conductive via;
forming a magnetic tunneling junction (MTJ) stack directly on the exposed top surface of the conductive via; and
patterning the MTJ stack such that re-deposition material is formed directly on sidewalls of the remaining portion of the dielectric material and directly on a first portion of a sidewall of the patterned MTJ stack without being formed directly on a second portion of the sidewall of the patterned MTJ stack.

17. The method of claim 16, further comprising removing the re-deposition material from the first portion of the sidewall of the patterned MTJ stack such that first portion of the sidewall of the patterned MTJ stack is exposed.

18. The method of claim 16, wherein the first portion of the sidewall of the patterned MTJ stack includes a pinned layer of the patterned MTJ stack and the second portion of the sidewall of the patterned MTJ stack includes a barrier layer of the patterned MTJ stack.

19. The method of claim 16, wherein the forming of the MTJ stack directly on the exposed top surface of the conductive via includes forming the MTJ stack directly on the top surface of the remaining portion of the dielectric material.

20. The method of claim 19, wherein the patterned MTJ stack is disposed directly on the top surface of the remaining portion of the dielectric material after the patterning of the MTJ stack.

\* \* \* \* \*